United States Patent [19]
Inoue

[11] Patent Number: 5,999,030
[45] Date of Patent: Dec. 7, 1999

[54] FLIP-FLOP CIRCUIT

[75] Inventor: Koji Inoue, Tokyo, Japan

[73] Assignee: Sony Corporation, Tokyo, Japan

[21] Appl. No.: 09/000,787

[22] Filed: Dec. 30, 1997

[30] Foreign Application Priority Data

Dec. 30, 1996 [JP] Japan .................................. 8-357702

[51] Int. Cl.$^6$ ............................. H03K 3/037; H03K 5/13
[52] U.S. Cl. ........................... 327/202; 327/211; 327/212; 327/258
[58] Field of Search ..................................... 327/202, 203, 327/208–213, 218, 225, 258, 295, 257, 296

[56] References Cited

U.S. PATENT DOCUMENTS 5,130,568  7/1992  Miller et al. .............................. 327/202
5,175,447 12/1992  Kawasaki et al. ....................... 327/211
5,619,157  4/1997  Kumata et al. .......................... 327/218

FOREIGN PATENT DOCUMENTS 1-109914  4/1989  Japan ..................................... 327/203

*Primary Examiner*—Tuan T. Lam
*Attorney, Agent, or Firm*—Ronald P. Kananen; Rader, Fishman & Grauer

[57] ABSTRACT

A clock control circuit is provided in a flip-flop circuit, since a first clock signal supplied to a master latch circuit is generated by an OR logic between a reference clock signal and a skew adjustment clock signal, a second clock signal supplied to a slave latch circuit is generated in accordance with the reference clock signal, the first clock signal has a phase advanced from the second clock signal by exactly an amount of a skew margin. An input signal is fetched into the flip-flop circuit at the rising edge of the first clock signal, then is output at the rising edge of the second clock signal. By this, malfunction due to the clock skew is prevented. The flip-flop circuit can operate as in the normal mode by holding the skew adjustment clock at a logic "0".

13 Claims, 8 Drawing Sheets

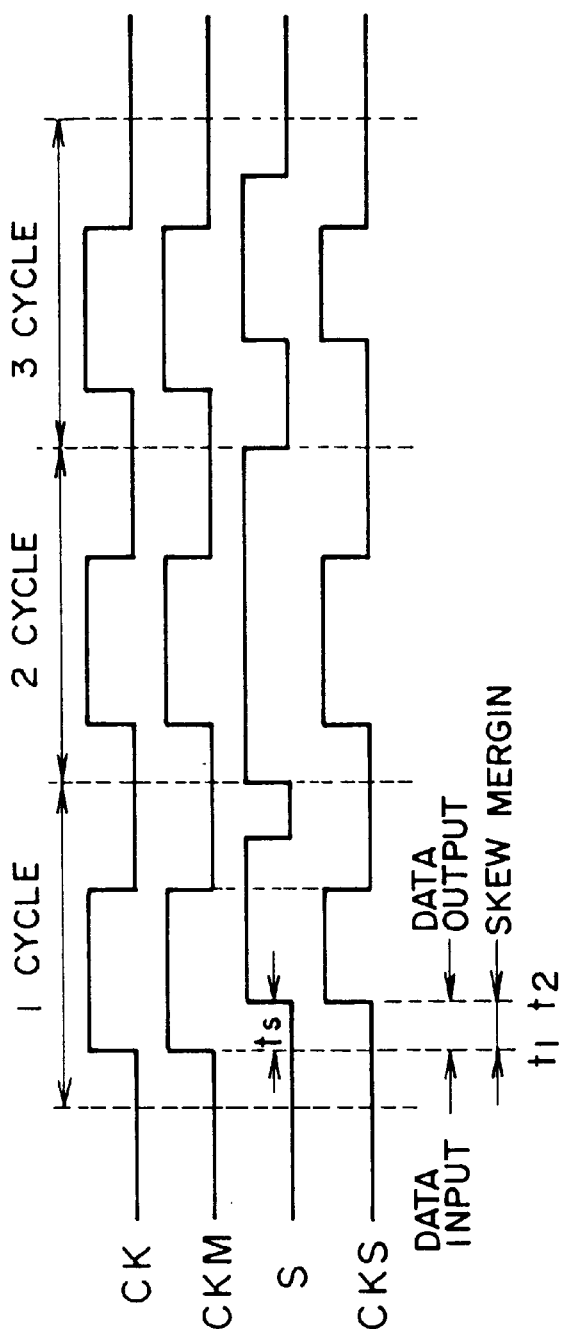

FLIP-FLOP CIRCUIT

BACKGROUND OF THE INVENTION

1. Field of the Invention

The present invention relates to a flip-flop circuit, more particularly relates to a flip-flop circuit capable of preventing a malfunction due to a clock skew.

2. Description of the Related Art

In recent years, the increasing miniaturization of the manufacturing process has led to an increase in the number of the logic circuits. To reduce the power consumption, use is made of many functional clock signals etc. resulting in a tendency for a larger clock skew in the chip. On the other hand, the delay time of the gates becomes smaller so the probability of erroneous operation due to the skew becomes higher.

To prevent an erroneous operation due to the skew in the logic circuit, the delay element of the data is formed so as to occupy a relatively large area. The control thereof also becomes more difficult.

Particularly in a scan flip-flop circuit having input/outputs of two systems of data, at a serial shift operation of a scan test, the serial output signal is directly connected to the serial signal input terminal of the next stage, so it suffers from the disadvantage that the data is propagated fast and therefore malfunction due to the skew is more apt to occur in comparison with the system input.

Arranging the two systems of clocks so as to prevent this makes the arrangement and interconnections excessively difficult and requires the addition of other circuits to the scan flip-flop circuit in order to adjust the timing, so causes a great increase in the chip area.

SUMMARY OF THE INVENTION

An object of the present invention is to provide a flip-flop circuit which can suppress an increase of the chip area to the lowest limit and avoid malfunction due to the clock skew. Particularly, in a scan flip-flop circuit having two systems of data inputs/outputs, the present invention provides a flip-flop circuit capable of preventing malfunction which is apt to occur at the time of a serial shift operation.

To achieve the above object, according to the first aspect of the present invention, there is provided a flip-flop circuit for inputting and outputting a signal in synchronization with a clock signal and having at least an adjustment mode in addition to a normal operation mode, having a first signal holding circuit for fetching an input signal in synchronization with a first clock signal and holding the same; a second signal holding circuit for holding and outputting a signal held by the first signal holding circuit in synchronization with a second clock signal; and a clock controlling circuit for generating the first and second clock signals synchronized in phases at the normal mode, respectively supplying them to the first and second signal holding circuit, controlling timings of the first and second clock signals so that the output timing of the second signal holding circuit to behind the timing of fetching of the first signal holding circuit at the adjustment mode, and outputting the same.

Further, in the present invention, the clock controlling circuit has a clock generating circuit for receiving an adjustment use clock signal having a different phase from that of a reference clock signal, and supplying a clock signal having the same phase as that of the reference clock signal to the second signal holding circuit as the second clock signal and, further, generating the first clock signal in accordance with the reference clock signal and the adjustment use clock signal and supplying the same to the first signal holding circuit.

Further, in the present invention, the clock controlling circuit has a clock generating circuit for receiving an adjustment use clock signal having a different phase from that of a reference clock signal, and supplying a clock signal having the same phase as that of the reference clock signal to the first signal holding circuit as the first clock signal and, further, generating the second clock signal in accordance with the reference clock signal and the adjustment use clock signal and supplying the same to the second signal holding circuit.

Further, in the present invention, there is provided a flip-flop circuit for inputting and outputting a signal in synchronization with a clock signal and capable of operating in at least two operation modes of a system mode and a scan mode, having a selecting circuit for receiving a switching signal and selecting either of a system input signal or a scan input signal in accordance with the level of the switching signal; a first signal holding circuit for fetching the signal selected by the selecting circuit in synchronization with the first clock signal and holding the same; a second signal holding circuit for holding and outputting the signal held by the first signal holding circuit in synchronization with the second clock signal; and a clock controlling circuit for receiving the reference clock signal and the adjustment use clock signal having a different phase from this, generating the first clock signal in accordance with the clock signal having an advanced phase between these clock signals, and supplying the same to the first signal holding circuit, and, further, generating the second clock signal in accordance with the signal having a delayed phase and supplying the same to the second signal holding circuit.

Further, in the present invention, preferably the clock controlling circuit receives the switching signal as the adjustment use clock signal, generates the first and second clock signals in accordance with the switching signal and the reference clock signal, and generates and outputs first and second clock signals having the same phase in accordance with the switching signal.

According to the present invention, first and second clock signals are generated in the flip-flop circuit in accordance with the reference clock signal and the adjustment use clock signal and are respectively output to the first and second signal holding circuit. When the skew adjustment is not carried out, the adjustment use clock signal is held at a predetermined level, first and second clock signals of the same phases are generated in accordance with the reference clock signal, and, when the skew adjustment is carried out, the first clock is generated in accordance with the clock signal having an advanced phase between the reference clock signal and the adjustment use clock signal and supplied to the first signal holding circuit, and the second clock signal is generated in accordance with the clock signal having the a delayed phase and supplied to the second signal holding circuit.

As a result, malfunction due to clock skew is avoided at the adjustment mode and the increase of the circuit area for preventing the skew can be suppressed to the lowest limit.

Further, according to the present invention, a flip-flop circuit capable of selecting and outputting either of the system input or the scan input by a selecting circuit is constituted. First and second clock signals for controlling the operation timing of the first and second signal holding circuit constituting the flip-flop circuit are generated in accordance with a reference clock signal and an adjustment use clock signal, whereby malfunction due to the clock skew can be prevented. Further, the switching signal for controlling the selecting circuit is input to the clock selecting circuit as the adjustment use clock signal and the first and second clock signals are generated in accordance with this, therefore the adjustment use signal becomes unnecessary, a skew margin can be secured by common use of the signal, and, at the same time, the interconnection region can be reduced and the increase of the circuit area can be suppressed to the lowest limit.

BRIEF DESCRIPTION OF THE DRAWINGS

The above and other objects and features of the present invention will be described more in detail with reference to the accompanying drawings, in which:

FIGS. 8A to 8D are waveform diagrams of the fourth embodiment.

DESCRIPTION OF THE PREFERRED EMBODIMENT

Figure 1:
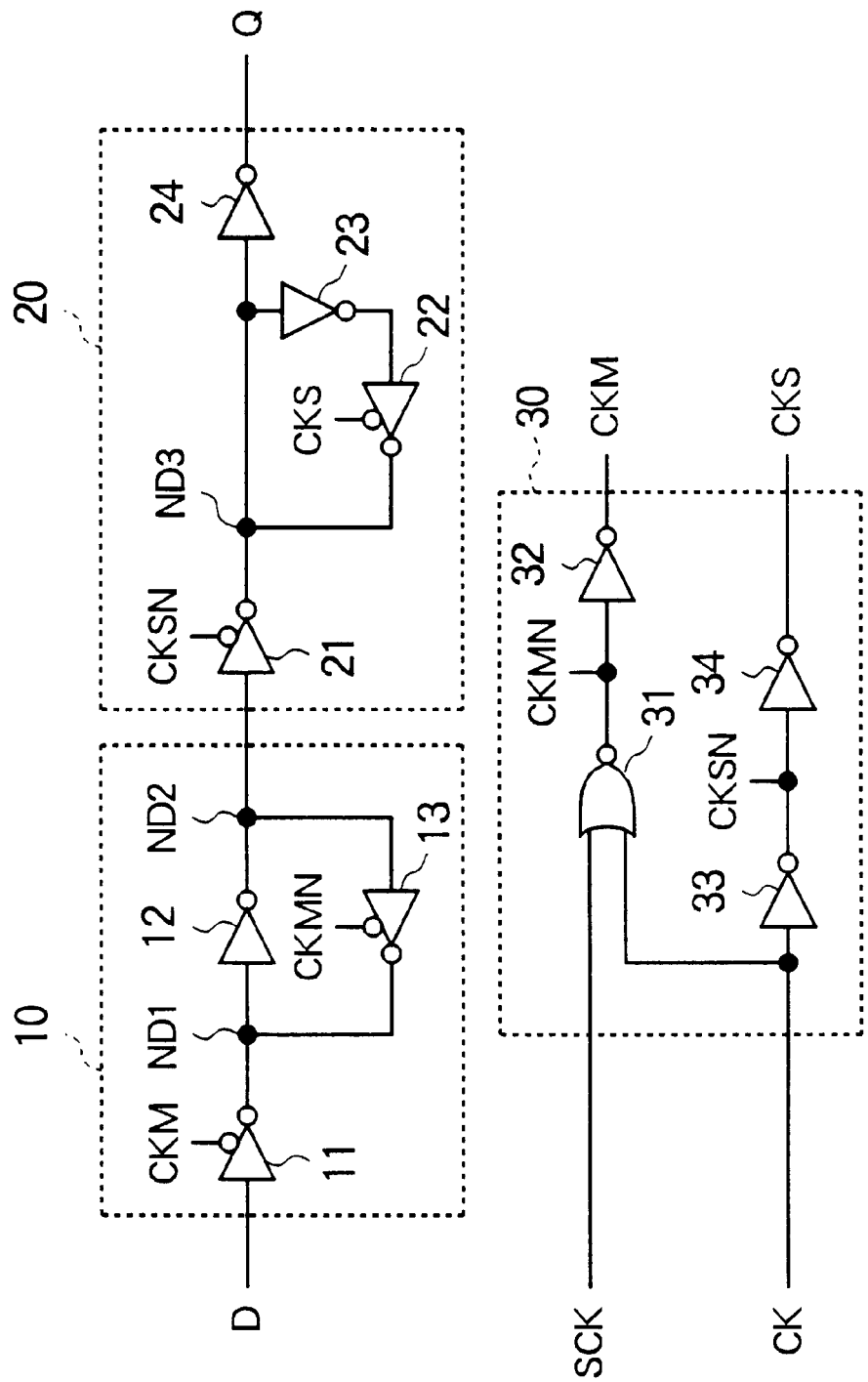
FIG. 1 is a circuit diagram of a flip-flop circuit according to a first embodiment of the present invention.

FIG. 1 is a circuit diagram of a flip-flop circuit according to a first embodiment of the present invention.

The characteristic feature of the present embodiment resides in that a clock signal CKM for a master latch circuit and a clock signal CKS for a slave latch circuit are separately generated and they are respectively supplied to the master latch circuit and the slave latch circuit. Below, the configuration and operation of the present embodiment will be explained by referring to FIG. 1 so as to more clearly clarify the characteristic feature of the present embodiment.

The flip-flop circuit of the present embodiment is constituted by a master latch circuit 10, a slave latch circuit 20, and a clock control circuit 30.

The master latch circuit 10 is constituted by an inverter 11 controlled in output timing by a master latch circuit use clock signal CKM, an inverter 13 controlled in output timing by an inverted signal CKMN of the clock signal CKM, and a usual inverter 12.

The slave latch circuit 20 is constituted by an inverter 21 controlled in output timing by an inverted signal CKSN of a slave latch circuit use clock signal CKS, an inverter 22 controlled in output timing by the slave latch circuit use clock signal CKS, and usual inverters 23 and 24.

The clock control circuit 30 is constituted by a NOR gate 31 and inverters 32, 33, and 34.

In the master latch circuit 10, the input terminal of the inverter 11 is connected to the input terminal of the signal D, and the output terminal is connected to the node ND1. The input terminal of the inverter 12 is connected to the node ND1, the output terminal is connected to the node ND2, and the node ND2 forms the output terminal of the master latch circuit 10. The input terminal of the inverter 13 is connected to the node ND2, and the output terminal is connected to the node ND1.

The inverter 11 changes in its output state in accordance with the level of the clock signal CKM. When the clock signal CKM is at a high level, the output terminal of the Inverter 11 is set to a high impedance state, and when the clock signal CKM is at a low level, the inverted signal of the input signal is output to the output terminal.

The inverter 13 changes in its output state in accordance with the inverted signal CKMN of the clock signal CKM. When the clock signal CKM is at a high level, that is, when the inverted signal CKMN thereof is at a low level, the inverted signal of the input signal is output to the output terminal of the inverter 13. When the inverted signal CKMN of the clock signal CKM is at a low level, the output terminal of the inverter 13 is set to the high impedance state.

In the master latch circuit 10 constituted in this way, when the clock signal CKM is at a low level, the inverted signal of the signal D is input to the node ND1 by the inverter 11. Further, the signal inverted by the inverter 12 and having the same phase as the signal D is input to the node ND2. When the clock signal CKM is switched from the low level to the high level, the output terminal of the inverter 11 is held in the high impedance state, the inverter 13 becomes an output state, and signals of the node ND1 and the node ND2 are latched.

In the slave latch circuit 20, the input terminal of the inverter 21 is connected to the output terminal of the master latch circuit 10, that is the node ND2, and the output terminal is connected to the node ND3. The input terminal of the inverter 24 is connected to the node ND3, and the output terminal is connected to the output terminal of the flip-flop circuit. The input terminal of the inverter 23 is connected to the node ND3, the output terminal is connected to the input terminal of the inverter 22, and the output terminal of the inverter 22 is connected to the node ND3.

The inverter 21 is controlled in its output state in accordance with the level of the inverted signal CKSN of the clock signal CKS. When the clock signal CKSN is at the high level, the output terminal of the inverter 21 is set in the high impedance state, and when the clock signal CKSN is at the low level, the inverted signal of the input signal is output to the output terminal.

The inverter 22 is controlled in its output state in accordance with the level of the clock signal CKS. When the clock signal CKS is at the high level, the output terminal is set in the high impedance state, and when the clock signal CKS is at the low level, the inverted signal of the input signal is output to the output terminal.

In the slave latch circuit 20 constituted in this way, when the clock signal CKS is at the high level, that is when the inverted signal CKSN thereof is at the low level, the output signal of the master latch circuit 10 is inverted by the inverter 21 and input to the node ND3. Further, the signal of the node ND3 is inverted by the inverter 24 and output as the output signal Q of the flip-flop circuit. When the clock signal CKS is at the low level, that is, when the inverted signal CKSN thereof is at the high level, the output terminal of the inverter 21 is held in the high impedance state and the inverter 22 becomes the output state. At this time, the signal of the node ND3 is latched by the inverters 23 and 22.

For this reason, at a rising edge where the clock signal CKM is switched from the low level to the high level, the input signal D is fetched into the flip-flop circuit. The signal fetched from the rising edge where the clock signal CKM is switched to the high level again is held by the master latch circuit 10. Then, the signal held by the master latch circuit 10 is output to the outside of the flip-flop circuit as the output signal Q of the flip-flop circuit at the rising edge of the clock signal CKS.

The clock control circuit 30 receives as input a clock signal SCK having a phase advanced from that of the reference clock signal CK by exactly the amount of the skew margin in addition to the reference clock signal CK.

The reference clock signal CK and the clock signal SCK are input to the two input terminals of the NOR gate 31. The inverted signal CKMN of the clock signal CKM is output by the NOR gate 31. The output terminal of the NOR gate 31 is connected to the input terminal of the inverter 32, while the clock signal CKM is output by the output terminal of the inverter 32. Namely, the master latch circuit use clock signal CKM is an OR logic between the reference clock signal CK and the clock signal SCK having the phase advanced from this reference clock signal CK by exactly the amount of the skew margin.

The reference clock signal CK is input to the inverter 33, the inverted signal CKSN of the clock signal CKS is output to the output terminal of the inverter 33, and the inverted signal CKSN is further inverted by the inverter 34 and output as the slave latch circuit use clock signal CKS.

For this reason, when there is a deviation between the reference clock signal CK and the clock signal SCK, the width of the clock signal CKM supplied to the master latch circuit 10 becomes longer by exactly an amount corresponding to the amount of this deviation. On the other hand, the clock signal CKS to be supplied to the slave latch circuit 20 is logically equivalent to the reference clock signal CK, so becomes a signal having almost the same phase as the reference clock signal CK.

In a flip-flop circuit controlled in operation timing by the clock signal CKM and the clock signal CKS, the signal D is fetched at the rising edge of the clock signal SCK having the advanced phase and the signal is output at the rising edge of the reference clock signal CK.

On the other hand, when the clock signal CKM and the clock signal CKS have the same phase, the phases of the clock signal CKM and the clock signal CKS respectively supplied to the master latch circuit 10 and the slave latch circuit 20 match, and the flip-flop circuit shown in FIG. 1 operates in the same way as the usual flip-flop circuit.

Further, when the clock signal CKS has a logic "0", for example, is held at the low level, the clock signal CKM supplied to the master latch circuit 10 becomes a signal having almost the same phase as the reference clock signal CK. In this case, the phases of the clock signal CKM and the clock signal CKS respectively supplied to the master latch circuit 10 and the slave latch circuit 20 coincide. By controlling the clock signal SCK in this way, the skew in the flip-flop circuit can be adjusted.

Figure 2:
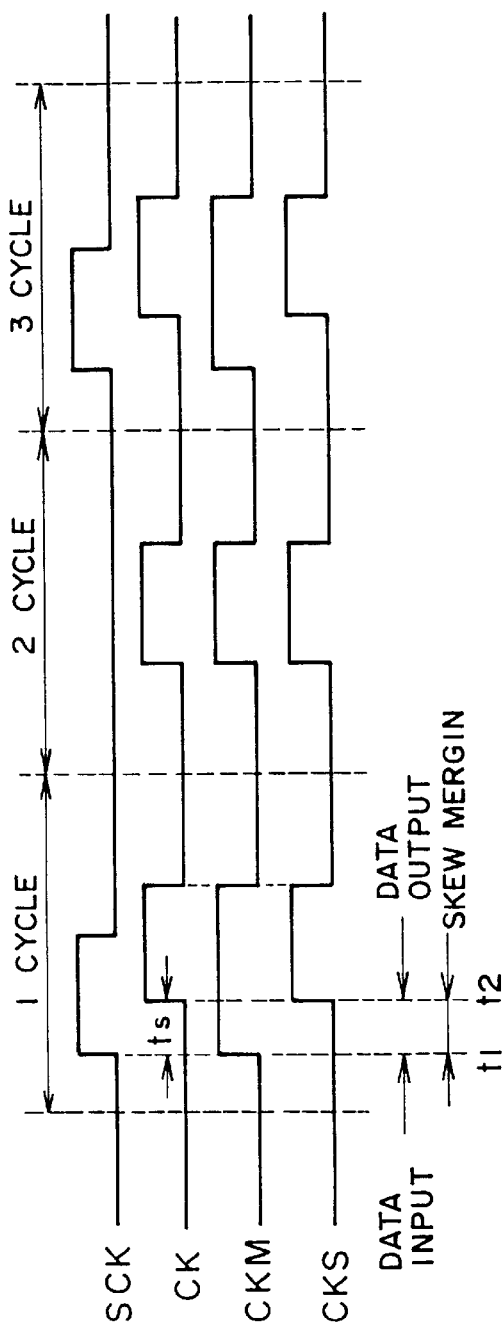
FIGS. 2A to 2D are waveform diagrams of the first embodiment.

FIG. 2 is a waveform diagram of the present embodiment. As illustrated, in a first cycle, a clock signal SCK having a phase advanced from the reference clock signal CK by exactly an amount of the skew margin is input to the flip-flop circuit. Namely, the clock signal SCK is advanced in phase from the reference clock signal CK by exactly an amount of a time $t_S$.

At a time $t_1$, the clock signal SCK rises, the clock signal CKM supplied to the master latch circuit 10 rises in accordance with this, and the input signal D is fetched into the flip-flop circuit and latched and held by the master latch circuit 10. Then, the reference clock signal CK rises with a time lag from the time $t_1$ by an amount of skew margin $t_S$, the clock signal CKS supplied to the slave latch circuit 20 rises in accordance with this, and the data held by the master latch circuit 10 is output as the output signal Q.

Then, in a second cycle, the skew adjustment use clock signal SCK is held at the logic "0", that is, the low level, therefore both of the clock signal CKM supplied to the master latch circuit 10 and the clock signal CKS supplied to the slave latch circuit 20 are generated by the reference clock signal CK and become clock signals having the same phase. In this case, as the overall flip-flop circuit, the input signal D is fetched into the internal portion at the rising edge of the reference clock signal CK, held, and output, therefore the circuit operation becomes equivalent to that of a general flip-flop circuit.

By using the flip-flop circuit of the present embodiment in a synchronously designed chip, the phase difference between the reference clock signal CK and the skew signal adjustment use clock signal SCK can be utilized as the margin of the malfunction due to the skew between flip-flop circuits of clock interconnections.

As explained above, according to the present embodiment, the clock control circuit 30 is provided in the flip-flop circuit, the clock signal CKM supplied to the master latch circuit 10 is generated by the OR logic between the reference clock signal CK and the skew adjustment use clock signal SCK, the clock signal CKS supplied to the slave latch circuit 20 is generated in accordance with the reference clock signal CK, the input signal D is fetched into the flip-flop circuit at the rising edge of the clock signal SCK having the advanced phase from the reference clock signal CK by exactly an amount of the skew margin, this is output at the rising edge of the reference clock signal CK, and the clock signal SCK is held at the logic "0", thereby to make the flip-flop circuit operate as in the usual way. Therefore, malfunction due to the clock skew can be prevented.

Second Embodiment

Figure 3:
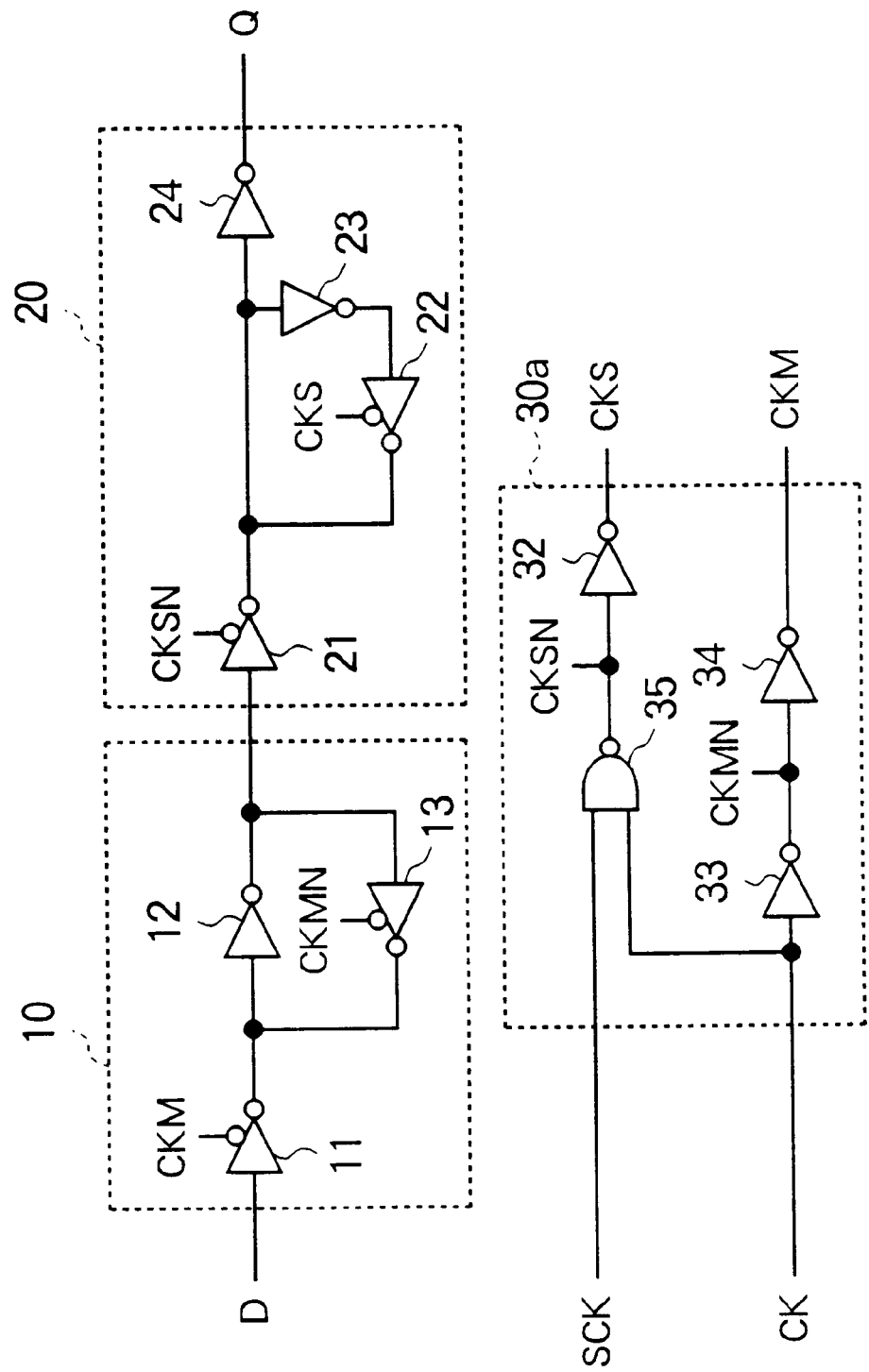
FIG. 3 is a circuit diagram of the flip-flop circuit according to a second embodiment of the present invention.

FIG. 3 is a circuit diagram of a flip-flop circuit according to a second embodiment of the present invention.

As illustrated, in the flip-flop circuit of the present embodiment, the master latch circuit 10 and the slave latch circuit 20 are substantially the same as those of the first embodiment shown in FIG. 1. They are respectively controlled in their operation by the master latch circuit use clock signal CKM and the slave latch circuit use clock signal CKS. In FIG. 3, the same constituent parts as those of the circuit are represented by using the same symbols as those of FIG. 1.

In the present embodiment, the configuration of the clock control circuit 30a is different from that of the first embodiment shown in FIG. 1. Below, an explanation will be made of the configuration and operation of the present embodiment based on the clock control circuit 30a.

As illustrated, the clock control circuit 30a is configured by a NAND gate 35 and the inverters 32, 33, and 34. In the same way as the clock control circuit 30 in the first embodiment shown in FIG. 1, in addition to the reference clock signal CK, a clock signal SCK having a phase delayed from this reference clock signal CK by exactly an amount of the skew margin is input to the clock control circuit 30a.

The reference clock signal CK and the clock signal SCK are input to the two input terminals of the NAND gate 35, while the inverted signal CKSN of the clock signal CKS is output by the NAND gate 35. The output terminal of the NAND gate 35 is connected to the input terminal of the inverter 32, while the clock signal CKS is output by the output terminal of the inverter 31.

On the other hand, the reference clock signal CK is output as the clock signal CKM via the inverters 33 and 34. The inverted signal CKMN of the clock signal CKM is output from the output terminal of the inverter 33.

Namely, the clock signal CKM supplied to the master latch circuit 10 becomes a signal which is logically equivalent to the reference clock signal CK and has almost the same phase. The clock signal CKS supplied to the slave latch circuit 20 is the AND logic between the reference clock signal CK and the clock signal SCK having a phase delayed from this reference clock signal CK by exactly an amount of skew margin. For this reason, when there is a deviation between the reference clock signal CK and the clock signal SCK, the width of the clock signal CKS to be supplied to the slave latch circuit 20 becomes shorter by exactly an amount corresponding to the amount of this deviation.

As the operation of the flip-flop circuit, the input signal D is fetched at the rising edge of the reference clock signal CK. The fetched signal is held by the master latch circuit 10, and the held signal is output as the output signal Q at the rising edge of the clock signal CKS.

Note that, in the present embodiment, when the skew adjustment use clock signal SCK is held at the logic "1", that is, the high level, the clock signals CKM and CKS supplied to the master latch circuit 10 and the slave latch circuit 20 are generated in accordance with the reference clock signal CK and become the same phase signals. In this case, the flip-flop circuit performs an equivalent circuit operation to that of the usual flip-flop circuit.

Figure 4:
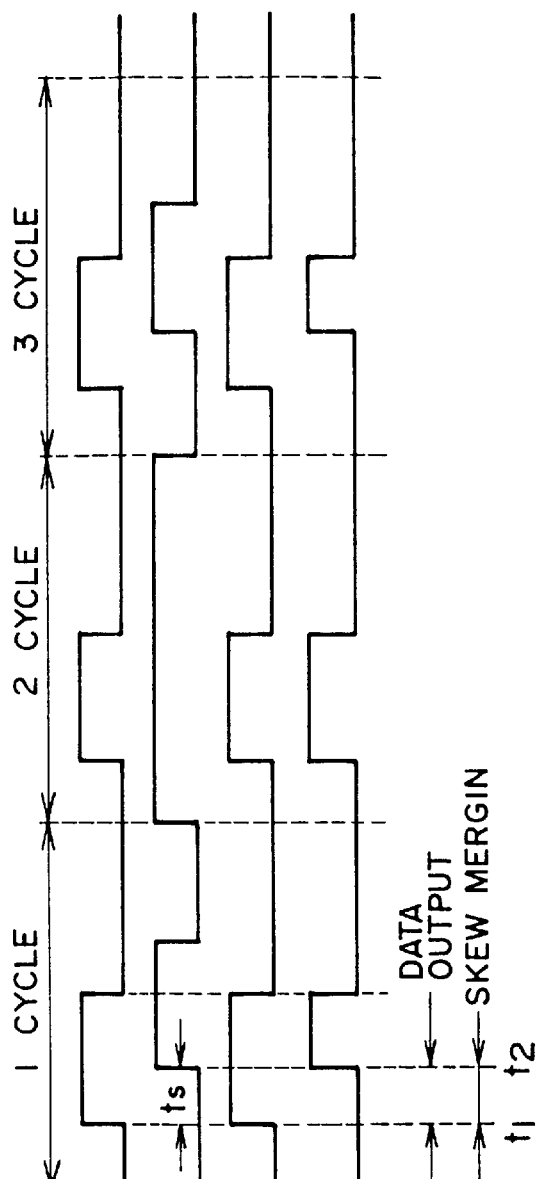
FIGS. 4A to 4D are waveform diagrams of the second embodiment.

FIG. 4 is a waveform diagram of the flip-flop circuit of the second embodiment shown in FIG. 3. Below, the operation of the present embodiment will be explained by referring to FIG. 4.

As illustrated, in the first cycle, the clock signal SCK having a phase delayed from the reference clock signal CK by exactly an amount of skew margin is input to the flip-flop circuit. Namely, the clock signal SCK is delayed in phase from the reference clock signal CK by exactly an amount of the time $t_S$.

The reference clock signal CK rises at the time $t_1$, the clock signal CKM supplied to the master latch circuit 10 rises in accordance with this, and the input signal D is fetched into the flip-flop circuit and latched and held by the master latch circuit 10. The skew adjustment clock signal SCK rises with a time lag from the time $t_1$ by an amount of the skew margin $t_S$, the clock signal CKS supplied to the slave latch circuit 20 rises in accordance with this, and the data held by the master latch circuit 10 is output as the output signal Q.

In the second cycle, the skew adjustment use clock signal SCK is held at the logic "1", that is, the high level, therefore both of the clock signal CKM supplied to the master latch circuit 10 and the clock signal CKS supplied to the slave latch circuit 20 are generated by the reference clock signal CK and become clock signals having the same phase. In this case, as the flip-flop circuit, the input signal D is fetched into the internal portion at the rising edge of the reference clock signal CK where it is held and output, therefore the circuit operation becomes equivalent to that of a general flip-flop circuit.

When designing a synchronous circuit in the chip using the flip-flop circuit of the present embodiment, the clock signal SCK delayed in phase from the reference clock signal CK by exactly a predetermined amount is generated inside the chip in advance. This delayed phase clock signal is supplied to the terminal of the clock signal SCK of each flip-flop circuit for flip-flop circuits not having the skew margin. On the other hand, a flip-flop circuit having the skew margin connects the input terminal of the clock signal SCK to a power supply voltage $V_{CC}$. In the usual circuit, in order to generate a signal delay element, a relatively large area becomes necessary, but by applying the flip-flop circuit of the present embodiment, the increase of the area can be suppressed to the lowest limit and malfunction due to the clock skew can be prevented.

As explained above, according to the present embodiment, the clock control circuit 30a is provided in the flip-flop circuit, the clock signal CKS supplied to the slave latch circuit 20 is generated by the AND logic between the reference clock signal CK and the skew adjustment use clock signal SCK, the clock signal CKM supplied to the master latch circuit 10 is generated in accordance with the reference clock signal CK, the input signal D is fetched into the flip-flop circuit at the rising edge of the reference clock signal CK, this is output at the rising edge of the clock signal SCK having the phase delayed from the reference clock signal CK by exactly an amount of skew margin, and the clock signal SCK is held at the logic "1", thereby to make the flip-flop circuit operate as in the usual way. Therefore, malfunction due to the clock skew can be prevented.

Third Embodiment

Figure 5:
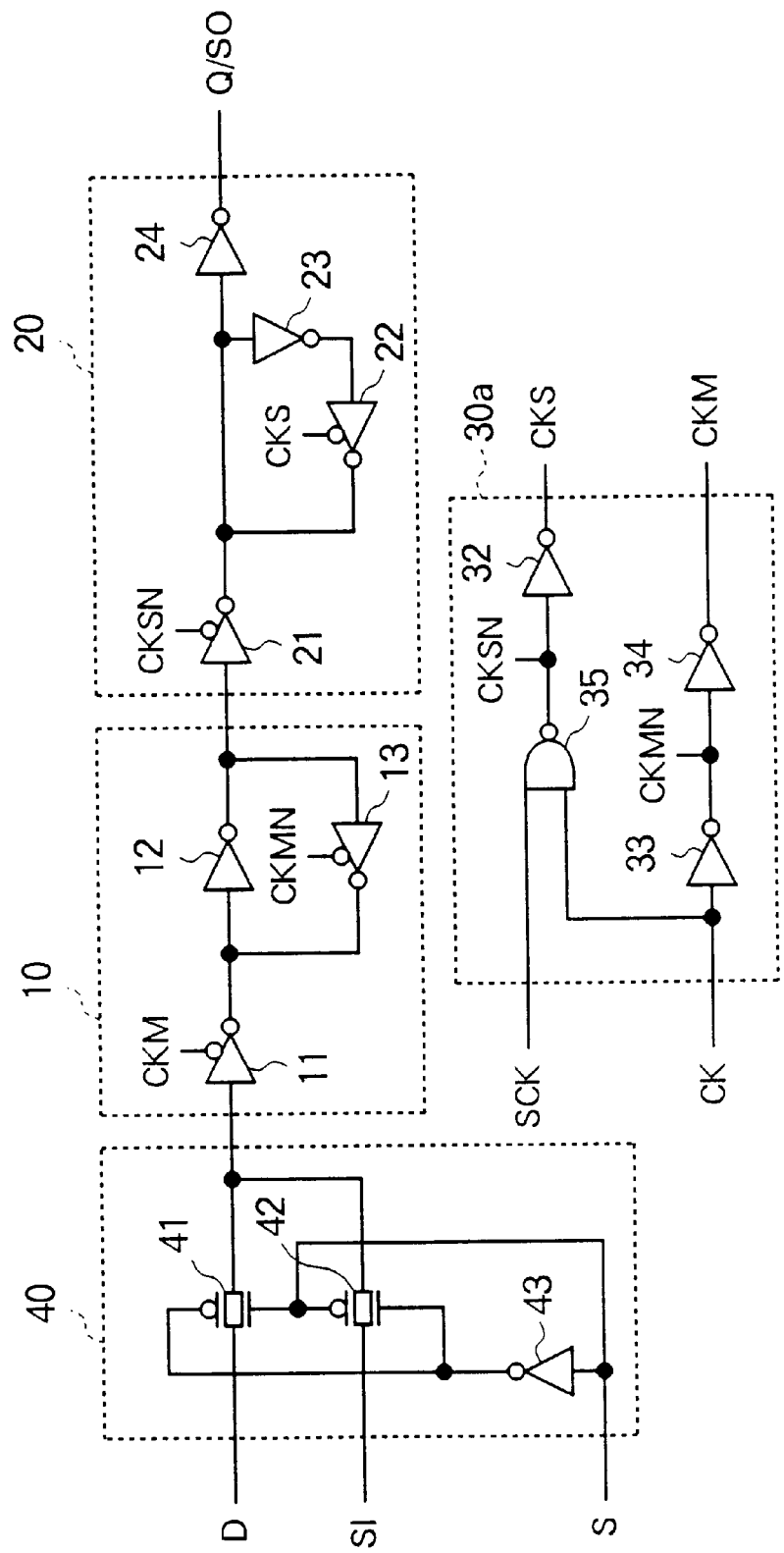
FIG. 5 is a circuit diagram of the flip-flop circuit according to a third embodiment of the present invention.

FIG. 5 is a circuit diagram of a flip-flop circuit according to a third embodiment of the present invention, in particular, a scan flip-flop circuit configured by using the flip-flop circuit of the second embodiment shown in FIG. 3.

As illustrated, in the present embodiment, a selector 40 of the system input signal D and the scan input signal SI is added to the input portion of the flip-flop circuit of the second embodiment. The selector 40 selects and fetches either of the scan input signal SI or the system input signal D by the scan mode switching signal S. The serial output SO and the usual output signal Q are output to the common output terminal.

The selector 40 is constituted by reference gates 41 and 42 and an inverter 43. When the switching signal S is at the high level, the transfer gate 41 is set to the conductive state and the transfer gate 42 is set in the high impedance state, therefore the input signal D is selected and input to the flip-flop circuit. At this time, the scan flip-flop circuit shown in FIG. 5 performs the usual system operation.

On the other hand, when the switching signal S is at the low level, the transfer gate 41 is set in the high impedance state and the transfer gate 42 is set in the conductive state, therefore the scan input signal (serial input signal) SI is selected and input to the flip-flop circuit. At this time, the scan flip-flop circuit performs the scan operation.

The skew adjustment operation in the flip-flop circuit is as explained in the second embodiment shown in FIG. 3. Here, a detailed explanation of the same will be omitted.

Below, an explanation will be made of the operation of the scan flip-flop circuit of the present embodiment by referring to the waveform diagram of FIG. 6.

Figure 6:
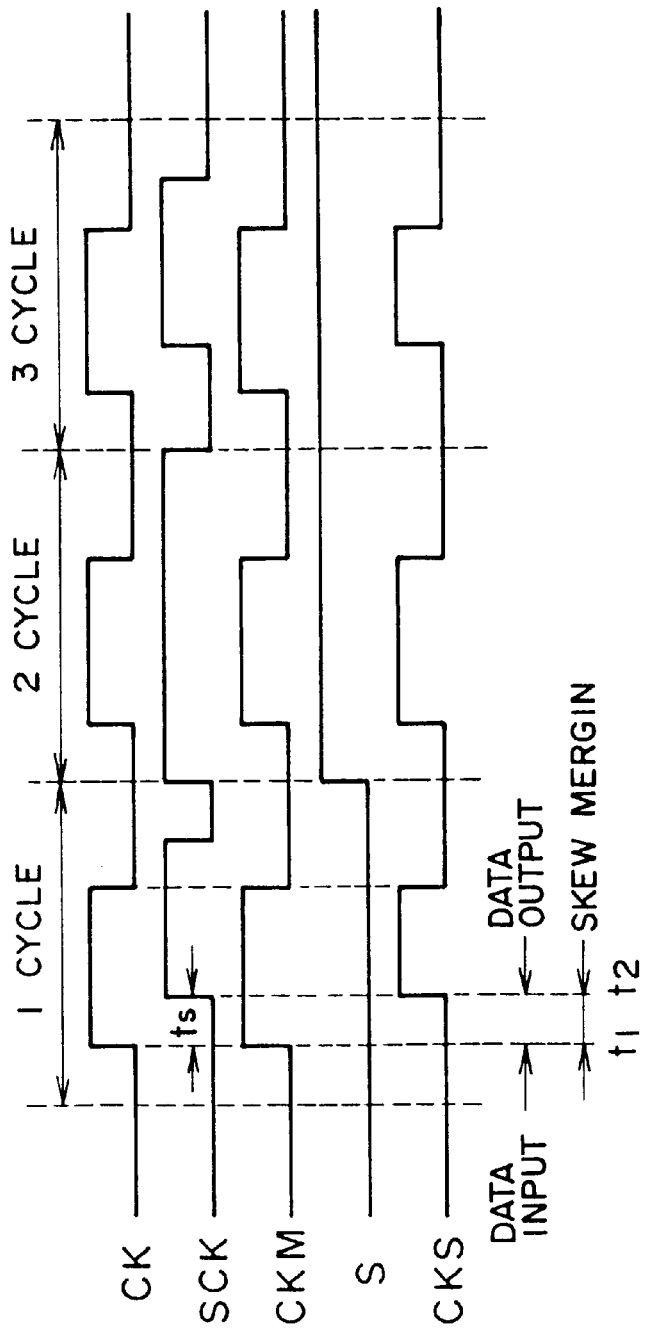
FIGS. 6A to 6E are waveform diagrams of the third embodiment.

In FIG. 6, the first cycle shows a serial scan operation in which skew adjustment is carried out, the second cycle shows the usual system operation in which skew adjustment is not carried out, and the third cycle shows the timing of signals at system operation in which the skew adjustment is carried out. By the skew adjustment use clock signal CKS input to the flip-flop circuit, it is possible to select whether or not the skew adjustment is carried out in any of the serial scan operation and system operation.

As shown in FIG. 6, in the first cycle, the switching signal S Is held at the low level and the flip-flop circuit operates in the scan mode. Namely, by the selector 40, the scan input signal SI is selected and input to the flip-flop circuit. Further, by inputting the skew adjustment use clock signal SCK having the phase delayed from the reference clock signal CK to the clock control circuit 30a, the skew adjustment is carried out.

The clock signal CKM supplied to the master latch circuit 10 rises at the rising edge of the reference clock signal CK. The scan input signal SI selected by the selector 40 is fetched into the flip-flop circuit and held. The skew adjustment use clock signal SCK rises with a time lag from this by an amount of the skew margin $t_S$, the clock signal CKS to be supplied to the slave latch circuit 20 rises in accordance with this, and the data held by the master latch circuit 10 is output as the serial output signal SO.

In the second cycle, the switching signal S is held at the high level, and the system input signal D is selected by the selector 40 and input to the flip-flop circuit. In this cycle, the skew adjustment use clock signal SCK is held at the high level, that is, the skew adjustment is not carried out, the flip-flop circuit operates in the normal mode, and the system input signal D is fetched at the rising edge of the reference clock signal CK and output as the system output signal Q.

In the third cycle, in the same way as the second cycle, the switching signal S is held at the high level, therefore the flip-flop circuit operates in the normal mode. Note, in this cycle, the skew adjustment is carried out by the supply of the clock signal SCK delayed in phase from the reference clock signal CK by exactly an amount of the skew margin. The clock signal CKM supplied to the master latch circuit 10 rises at the rising edge of the reference clock signal CK, and the system input signal D selected by the selector 40 is fetched into the flip-flop circuit and held. The skew adjustment use clock signal SCK rises with a time lag from this by an amount of the skew margin $t_S$, the clock signal CKS to be supplied to the slave latch circuit 20 rises in accordance with this, and the data held by the master latch circuit 10 is output as the system output signal Q.

Fourth Embodiment

Figure 7:
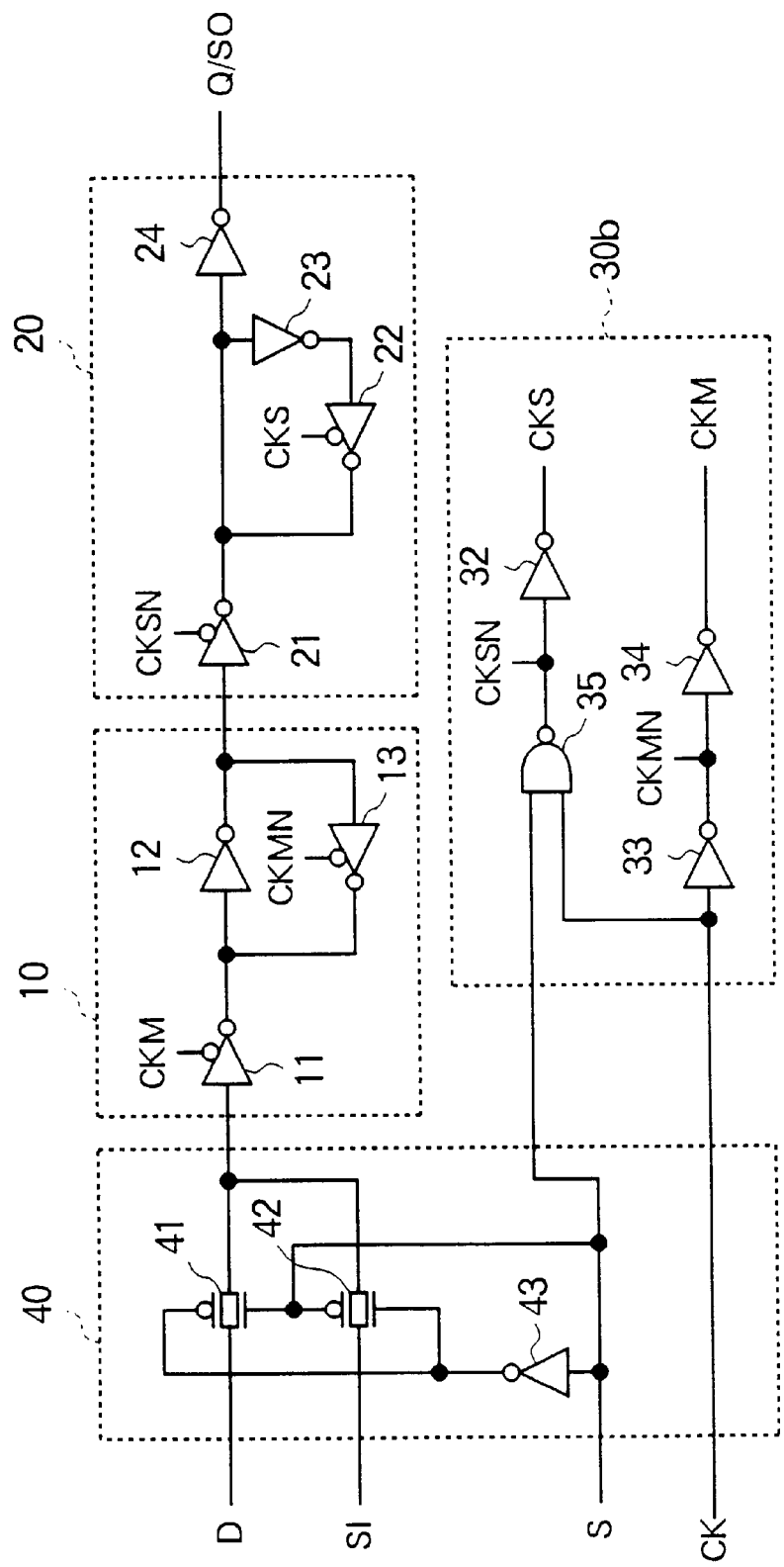
FIG. 7 is a circuit diagram of the flip-flop circuit according to a fourth embodiment of the present invention.

FIG. 7 is a circuit diagram of a flip-flop circuit according to a fourth embodiment of the present invention, in particular, a scan flip-flop circuit configured by using the flip-flop circuit of the second embodiment shown in FIG. 3.

In general, at the time of a serial shift operation of a scan test, the speed of propagation of the signal is fast since the serial output SO of the front stage is directly connected to the serial input SI of the rear stage, so malfunction due to clock skew easily occurs in comparison with the time of system operation. Therefore, in the present embodiment, by performing the skew adjustment from the external portion at only the time of a serial scan operation, the scan mode switching signal S and the skew adjustment use clock signal SCK are used in common.

As illustrated, in the clock control circuit 30b, the input terminal of the NAND gate 35 is connected to the input terminal of the switching signal S and the reference clock signal CK. For this reason, when the switching signal S is held at the high level, that is, when the system input signal D is selected by the selector 40 and the flip-flop circuit operates in the normal mode, clock signals having substantially the same phase as that of the reference clock signal CK are supplied to the master latch circuit 10 and the slave latch circuit 20 and the skew adjustment is not carried out.

On the other hand, when the switching signal S is held at the low level, the scan input signal SI is selected by the selector 40, and the flip-flop circuit operates in the scan mode, the scan input signal SI selected by the selector 40 is fetched into the flip-flop circuit at the rising edge of the reference clock signal CK, and the switching signal S is switched to the high level with a time delay from this by exactly an amount of the skew margin, whereby the data held by the master latch circuit 10 of the flip-flop circuit is output as the serial output SO to the external portion at the timing of this switching. As a result, both functions of the setting of the mode and the skew adjustment can be realized by the switching signal S, the skew margin is secured and simultaneously the interconnection region is reduced, and the increase of the circuit area can be suppressed.

FIG. 8 is a waveform diagram of the flip-flop circuit of the present embodiment. In FIG. 8, the first cycle and the third cycle show the serial scan operation in which the skew adjustment is carried out, and the second cycle shows the system operation in which the skew adjustment is not carried out.

As illustrated, in the first cycle, at the rising edge of the reference clock signal CK, the switching signal S is held at the low level and the scan input signal SI is selected by the selector 40 and fetched into the flip-flop circuit and held. The switching signal S rises with a time delay from this by an amount of the skew margin $t_S$, the clock signal CKS supplied to the slave latch circuit 20 rises in accordance with this, and the data held by the master latch circuit 10 is output as the serial output signal SO.

In the second cycle, the switching signal S is held at the high level, therefore the system input signal D is selected by the selector 40 and the flip-flop circuit operates in the normal mode. In this case, the clock signals supplied to the master latch circuit 10 and the slave latch circuit 20 are the same in phase with the reference clock signal CK, the flip-flop circuit operates as usual, and skew adjustment is not carried out.

In the third cycle, in the same way as the first cycle, the flip-flop circuit operates in the scan mode, then skew adjustment is carried out by the switching signal S.

In the flip-flop circuit of the present embodiment, the skew adjustment can be carried out only at the time of a scan mode operation. Skew adjustment is not carried out at the normal mode operation.

When the circuit is configured by using the flip-flop circuit of the present embodiment, for example, the scan mode switching signal S of all flip-flop circuits is driven by a specific main input terminal and a pull-up resistor is attached to this input terminal. Taking note of only the delay of the signal on the system input side, measures are taken against the skew by insertion of a timing adjustment use buffer or the like. The input terminal of the switching signal S is placed in an open state at the time of normal operation, the switching signal S is fixed to the high level by the pull-up resistor, and each flip-flop circuit performs a system operation as if it were a clock of a single phase. On the other hand, by controlling the terminal of the switching signal S by the control signal from the external portion by exactly an amount commensurate with the skew of the entire chip at the time of a scan operation, adjustment of the clock skew can be carried out.

As explained above, according to the flip-flop circuit of the present invention, there are the advantages that malfunction due to the clock skew of an LSI chip can be prevented, the increase of the circuit area for adjusting the clock skew can be suppressed to the lowest limit, and the skew margin can be secured and, simultaneously, the load of the arrangement and interconnection tools due to the increase of the number of interconnections can be reduced.

What is claimed is:

1. A flip-flop circuit for inputting and outputting a signal in synchronization with first and second clock signals and having at least an adjustment mode in addition to a normal operation mode, said flip-flop circuit having:

a first signal holding circuit for fetching an input signal in synchronization with said first clock signal and holding the same;

a second signal holding circuit for holding and outputting the signal held by the first signal holding circuit in synchronization with said second clock signal; and a clock controlling circuit for generating the first and second clock signals synchronized in phases in the normal operation mode, respectively supplying the first and second clock signals to the first and second signal holding circuits, controlling timings of the first and second clock signals so that the output timing of the second signal holding circuit is behind the timing of fetching of the first signal holding circuit in the adjustment mode, and outputting the same.

2. A flip-flop circuit as set forth in claim 1, wherein the clock controlling circuit has a clock generating circuit for receiving a reference clock signal and an adjustment use clock signal in the adjustment mode operation having a different phase from that of said reference clock signal, and supplying a clock signal having the same phase as that of the reference clock signal to the second signal holding circuit as the second clock signal and, further, generating the first clock signal in accordance with the reference clock signal and the adjustment use clock signal and supplying the same to the first signal holding circuit.

3. A flip-flop circuit as set forth in claim 2, wherein, in the normal operation mode, the clock generating circuit generates a clock signal having the same phase as that of the reference clock signal and outputs the same as the first clock signal.

4. A flip-flop circuit as set forth in claim 2, wherein the clock generating circuit has a logic circuit for generating an OR logic between the reference clock signal and the adjustment use clock signal.

5. A flip-flop circuit as set forth in claim 1, wherein the clock controlling circuit has a clock generating circuit for receiving a reference clock signal and an adjustment use clock signal in the adjustment mode operation having a different phase from that of said reference clock signal, and supplying a clock signal having the same phase as that of the reference clock signal to the first signal holding circuit as the first clock signal and, further, generating the second clock signal in accordance with the reference clock signal and the adjustment use clock signal and supplying the same to the second signal holding circuit.

6. A flip-flop circuit as set forth in claim 5, wherein in the normal operation mode, the clock generating circuit generates a clock signal having the same phase as that of the reference clock signal and outputs the same as the second clock signal.

7. A flip-flop circuit as set forth in claim 5, wherein the clock generating circuit has a logic circuit for generating an AND logic between the reference clock signal and the adjustment use clock signal.

8. A flip-flop circuit as set forth in claim 4, wherein the OR logic consists of a NOR gate and an inverter connected in series.

9. A flip-flop circuit as set forth in claim 7, wherein the AND logic consists of a NAND gate and an inverter connected in series.

10. A flip-flop circuit for inputting and outputting a signal in synchronization with first and second clock signals and capable of operating in at least two operation modes of a system mode and a scan mode, said flip-flop circuit having:

a selecting circuit for receiving a switching signal and selecting either of a system input signal or a scan input signal in accordance with the level of the switching signal;

a first signal holding circuit for fetching the signal selected by the selecting circuit in synchronization with the first clock signal and holding the same;

a second signal holding circuit for holding and outputting the signal held by the first signal holding circuit in synchronization with the second clock signal; and a clock controlling circuit for receiving a reference clock signal and an adjustment use clock signal having a different phase from that of the reference clock signal, generating the first clock signal in accordance with a clock signal having an advanced phase between the reference and adjustment use clock signals, and supplying the same to the first signal holding circuit, and, further, generating the second clock signal in accordance with a clock signal having a delayed phase between the reference and adjustment use clock signals and supplying the same to the second signal holding circuit.

11. A flip-flop circuit as set forth in claim 10, wherein the clock controlling circuit generates and outputs the first and second clock signals synchronized in phase in accordance with a level of the adjustment use clock signal.

12. A flip-flop circuit as set forth in claim 10, wherein the clock controlling circuit receives the switching signal as the adjustment use clock signal and generates the first and second clock signals in accordance with the switching signal and the reference clock signal.

13. A flip-flop circuit as set forth in claim 8, wherein:

in the system mode, the clock controlling circuit generates and outputs first and second clock signals having the same phase in accordance with the switching signal.

* * * * *